US005691114A

United States Patent [19]

Burberry et al.

[11] Patent Number: 5,691,114

[45] Date of Patent: Nov. 25, 1997

[54] METHOD OF IMAGING OF LITHOGRAPHIC PRINTING PLATES USING LASER ABLATION

[75] Inventors: Mitchell Stewart Burberry, Webster; Charles David DeBoer, Rochester; Sharon Wheten Weber, Webster, all of N.Y.

[73] Assignee: Eastman Kodak Company, Rochester, N.Y.

[21] Appl. No.: 719,098

[22] Filed: Sep. 24, 1996

Related U.S. Application Data

[62] Division of Ser. No. 614,437, Mar. 12, 1996, Pat. No. 5,605,780.

[51] Int. Cl.[6] .............................. G03F 7/20; G03F 7/09; B41M 1/06

[52] U.S. Cl. ......................... 430/302; 430/944; 101/457; 101/450.1; 101/463.1

[58] Field of Search .................................... 430/302, 944; 101/457, 450.1, 463.1

[56] References Cited

U.S. PATENT DOCUMENTS

| | | | |
|---|---|---|---|
| 3,506,779 | 4/1970 | Brown et al. | 178/6.6 |
| 3,549,733 | 12/1970 | Caddell | 264/26 |
| 3,568,597 | 3/1971 | Staehle | 430/278.1 |
| 3,574,657 | 4/1971 | Burnett | 117/8 |
| 3,793,033 | 2/1974 | Mukherjee | 96/115 R |
| 3,832,948 | 9/1974 | Barker . | |
| 3,945,318 | 3/1976 | Landsman | 101/467 |
| 3,962,318 | 6/1976 | Eames | 428/323 |
| 3,964,389 | 6/1976 | Peterson | 101/467 |
| 4,034,183 | 7/1977 | Uhlig | 219/467 |
| 4,054,094 | 10/1977 | Caddell | 101/467 |
| 4,081,572 | 3/1978 | Pacansky | 427/53 |
| 4,334,006 | 6/1982 | Kitajima | 430/254 |
| 4,634,644 | 1/1987 | Irving et al. | 430/18 |
| 4,693,958 | 9/1987 | Schwartz | 430/302 |
| 4,731,317 | 3/1988 | Fromson | 430/159 |
| 5,238,778 | 8/1993 | Hirai | 430/200 |
| 5,262,275 | 11/1993 | Fan | 430/944 X |
| 5,351,617 | 10/1994 | Williams et al. | 430/302 X |
| 5,353,705 | 10/1994 | Lewis | 101/453 |
| 5,385,092 | 1/1995 | Lewis . | |
| 5,395,729 | 3/1995 | Reardon | 430/200 |
| 5,429,909 | 7/1995 | Kaszuczuk et al. | 430/944 X |
| 5,468,591 | 11/1995 | Pearce et al. | 430/201 |
| 5,576,144 | 11/1996 | Pearce et al. | 430/944 X |

FOREIGN PATENT DOCUMENTS

| | | | |
|---|---|---|---|
| 0 001 068 | 3/1979 | European Pat. Off. . | |
| 0 573 091 | 12/1993 | European Pat. Off. . | |
| 4-134346A | 5/1992 | Japan | 430/281 |

OTHER PUBLICATIONS

Hatta et al, 111:234082 Chemical Abstracts of Appl. Surf. Sci. (1989), 37(3), 299–305, American Chemical Society.

Magen et al, 111:221927 Chemical Abstracts of Chemtronics (1989), 4(2), 74–7, American Chemical Society.

Hogan et al, 110:125159 Chemical Abstracts of Applied Surf. Sci. (1989), vol. Date 1988, 36(1–4), 343–9, American Chemical Society.

Magan et al, 111:105590, Chemical Abstracts of Proc. Spie–Int. Soc. Opt. Eng. (1989), 1022 (Laser Assisted Process), 118–23, American Chemical Society.

*Primary Examiner*—Cynthia Hamilton

*Attorney, Agent, or Firm*—J. Lanny Tucker

[57] ABSTRACT

A lithographic printing plate is comprised of an anodized aluminum support having thereon an oleophilic image-forming layer comprising an infrared-absorbing agent dispersed in a film-forming cyanoacrylate polymer binder. The plate is imagewise exposed to a focused high-intensity infrared laser beam which removes the oleophilic image-forming layer by thermal ablation to thereby reveal the underlying hydrophilic support surface. The cyanoacrylate polymers provide superior performance due to their combination of low decomposition temperature, good ink receptivity, good adhesion to the support and good wear characteristics.

20 Claims, No Drawings

METHOD OF IMAGING OF LITHOGRAPHIC PRINTING PLATES USING LASER ABLATION

CROSS-REFERENCE TO RELATED APPLICATIONS

This is a Divisional of allowed application Ser. No. 08/614,437, filed Mar. 12, 1996 U.S. Pat. No. 5,605,780.

Copending commonly-assigned U.S. patent application Ser. No. 260,652, filed Jun. 14, 1994, "Lithographic Printing Plates Utilizing An Oleophilic Imaging Layer" by Mitchell S. Burberry, Sharon W. Weber and Charles D. DeBoer, describes a lithographic printing plate comprising a support having a porous hydrophilic surface and an oleophilic image-forming layer which prior to exposure is readily removable by means such as peeling or rubbing but which upon imagewise exposure interacts in the exposed areas with the porous hydrophilic surface so as to bond strongly thereto.

Copending commonly-assigned U.S. patent application Ser. No. 455,323, filed May 31, 1995, "Method For Preparation Of An Imaging Element" by Lee W. Tutt, Gerald T. Frizelle and Linda Kaszczuk, describes the preparation of a lithographic printing plate by a method comprising the steps of:

(1) providing a first element which serves as an image-donating element, the first element comprising a support and an image-forming layer which is infrared-absorptive;

(2) providing a second element which serves as an image-receiving element;

(3) generating an image on the first element by imagewise laser-induced thermal ablation of the image-forming layer; and (4) transferring the image from the first element to the second element by the steps of lamination and peeling.

FIELD OF THE INVENTION

This invention relates in general to lithography and in particular to a novel lithographic printing plate. More specifically, this invention relates to a lithographic printing plate having an image-forming layer that is especially adapted to be imaged by laser-induced thermal ablation.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Aluminum has been used for many years as a support for lithographic printing plates. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168 and 4,919,774.

In the manufacture of lithographic printing plates, the graining process is typically followed by an anodizing process, utilizing an acid such as sulfuric or phosphoric acid, and the anodizing process is typically followed by a process which renders the surface hydrophilic such as a process of thermal silication or electrosilication. The anodization step serves to provide an anodic oxide layer and is preferably controlled to create a layer of at least 0.3 $g/m^2$. Processes for anodizing aluminum to form an anodic oxide coating and then hydrophilizing the anodized surface by techniques such as silication are very well known in the art, and need not be further described herein.

Included among the many patents relating to processes for anodization of lithographic printing plates are U.S. Pat. Nos. 2,594,289, 2,703,781, 3,227,639, 3,511,661, 3,804,731, 3,915,811, 3,988,217, 4,022,670, 4,115,211, 4,229,266 and 4,647,346. Illustrative of the many materials useful in forming hydrophilic barrier layers are polyvinyl phosphonic acid, polyacrylic acid, polyacrylamide, silicates, zirconates and titanates. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 4,090,880, 4,153,461, 4,376,914, 4,383,987, 4,399,021, 4,427,765, 4,427,766, 4,448,647, 4,452,674, 4,458,005, 4,492,616, 4,578,156, 4,689,272, 4,935,332 and European Patent No. 190,643.

The result of subjecting aluminum to an anodization process is to form an oxide layer which is porous. Pore size can vary widely, depending on the conditions used in the anodization process, but is typically in the range of from about 0.1 to about 10 micrometers. The use of a hydrophilic barrier layer is optional but preferred. Whether or not a barrier layer is employed, the aluminum support is characterized by having a porous wear-resistant hydrophilic surface which specifically adapts it for use in lithographic printing, particularly in situations where long press runs are required.

A wide variety of radiation-sensitive materials suitable for forming images for use in the lithographic printing process are known. Any radiation-sensitive layer is suitable which, after exposure and any necessary developing and/or fixing, provides an area in imagewise distribution which can be used for printing.

Useful negative-working compositions include those containing diazo resins, photocrosslinkable polymers and photopolymerizable compositions. Useful positive-working compositions include aromatic diazooxide compounds such as benzoquinone diazides and naphthoquinone diazides.

Lithographic printing plates of the type described hereinabove are usually developed with a developing solution after being imagewise exposed. The developing solution, which is used to remove the non-image areas of the imaging layer and thereby reveal the underlying porous hydrophilic support, is typically an aqueous alkaline solution and frequently includes a substantial amount of organic solvent. The need to use and dispose of substantial quantities of alkaline developing solution has long been a matter of considerable concern in the printing art.

Efforts have been made for many years to manufacture a printing plate which does not require development with an alkaline developing solution. Examples of the many patents and published patent applications relating to such prior efforts include:

(1) Brown et al, U.S. Pat. No. 3,506,779, issued Apr. 14, 1970.

This patent describes a process in which a printing plate blank is imagewise exposed with a laser beam which is intensity modulated and deflected in accordance with control signals. The exposed areas are vaporized, thereby forming ink transferring recesses for intaglio printing or leaving raised ink transferring surfaces for letter press printing, or chemically altered to facilitate further processing.

(2) Caddell, U.S. Pat. No. 3,549,733, issued Dec. 22, 1970.

This patent describes a method for producing a printing plate in which a polymeric surface layer is subjected to a controlled laser beam of sufficient intensity to decompose the layer and form depressions in the surface of the plate.

(3) Burnett, U.S. Pat. No. 3,574,657, issued Apr. 13, 1971.

This patent describes a method for producing a printing plate in which an image is formed by exposing a cured allylic resin coating to a heat pattern.

(4) Mukherjee, U.S. Pat. No. 3,793,033, issued Feb. 19, 1974.

This patent describes a lithographic printing plate comprising a support and a hydrophilic imaging layer comprising a phenolic resin, an hydroxyethylcellulose ether and a photoinitiator. Upon imagewise exposure, the imaging layer becomes oleophilic in the exposed areas while remaining hydrophilic in the unexposed areas and thus can be used on a lithographic printing press, utilizing conventional inks and fountain solutions, without the need for a development step and consequently without the need for a developing solution.

(5) Barker, U.S. Pat. No. 3,832,948, issued Sep. 3, 1974.

This patent describes a method for producing a printing plate in which a surface in relief is formed by scanning coherent radiation over the surface of a radiation-absorptive thin film supported by a plastic substrate.

(6) Landsman, U.S. Pat. No. 3,945,318, issued Mar. 23, 1976.

This patent describes a method in which a lithographic printing plate blank is processed by applying a beam of laser radiation through a radiation transparent sheet to transfer selected portions on the sheet onto a lithographic surface.

(7) Eames, U.S. Pat. No. 3,962,513, issued Jun. 8, 1976.

This patent describes a method for producing a printing plate in which a transfer film comprising a transparent substrate, a layer comprising particles which absorb laser energy, and a layer of ink receptive resin is exposed with a laser beam to effect transfer to a lithographic surface.

(8) Peterson, U.S. Pat. No. 3,964,389, issued Jun. 22, 1976.

This patent describes a method for producing a printing plate in which a transfer film comprising a transparent substrate and a layer comprising particles which absorb laser energy is exposed with a laser beam to effect transfer to a lithographic surface.

(9) Uhlig, U.S. Pat. No. 4,034,183, issued Jul. 5, 1977.

This patent describes a lithographic printing plate comprising a support and a hydrophilic imaging layer that is imagewise exposed with laser radiation to render the exposed areas oleophilic and thereby form a lithographic printing surface. The printing plate can be used on a lithographic printing press employing conventional inks and fountain solutions without the need for a development step. If the hydrophilic imaging layer is water-insoluble, the unexposed areas of the layer serve as the image background. If the hydrophilic imaging layer is water-soluble the support which is used must be hydrophilic and then the imaging layer is removed in the unexposed areas by the fountain solution to reveal the underlying hydrophilic support.

(10) Caddell et al, U.S. Pat. No. 4,054,094, issued Oct. 18, 1977.

This patent describes a lithographic printing plate comprised of a support, a polymeric layer on the support, and a thin top coating of a hard hydrophilic material on the polymeric layer. A laser beam is used to etch the surface of the plate, thereby rendering it capable of accepting ink in the etched regions and accepting water in the unetched regions.

(11) Pacansky, U.S. Pat. No. 4,081,572, issued Mar. 28, 1978.

This patent describes printing plates comprising a substrate and a coating of a hydrophilic polymer containing carboxylic acid functionality which can be selectively imagewise converted to a hydrophobic condition by heat.

(12) Kitajima et al, U.S. Pat. No. 4,334,006, issued Jun. 8, 1982.

This patent describes a method for forming an image in which a photosensitive material composed of a support and a layer of a photosensitive composition is exposed and developed by heating in intimate contact with a peeling development carrier sheet and subsequently peeling the carrier sheet from the photosensitive material.

(13) Schwartz et al, U.S. Pat. No. 4,693,958, issued Sep. 15, 1987.

This patent describes a lithographic printing plate comprising a support and a hydrophilic water-soluble heat-curable imaging layer which is imagewise exposed by suitable means, such as the beam of an infrared laser, to cure it and render it oleophilic in the exposed areas. The uncured portions of the imaging layer can then be removed by merely flushing with water.

(14) Fromson et al, U.S. Pat. No. 4,731,317, issued Mar. 15, 1988.

This patent describes a lithographic printing plate comprising a grained and anodized aluminum substrate having thereon a coating comprising a diazo resin in admixture with particulate energy-absorbing material that will absorb incident radiation and re-radiate it as radiation that will change the diazo resin coating.

(15) Hirai et al, U.S. Pat. No. 5,238,778, issued Aug. 24, 1993.

This patent describes a method of preparing a lithographic printing plate utilizing an element comprising a support having thereon a heat transfer layer containing a colorant, a heat-fusible substance and a photo-curable composition. Heat is applied in an image pattern to transfer the image onto a recording material having a hydrophilic surface and the transferred image is exposed to actinic radiation to cure it.

(16) Lewis et al, U.S. Pat. No. 5,353,705, issued Oct. 11, 1994.

This patent describes lithographic printing plates, suitable for imaging by means of laser devices which ablate one or more layers, which include a secondary ablation layer that ablates only partially as a result of destruction of overlying layers.

(17) Lewis et al, U.S. Pat. No. 5,385,092, issued Jan. 31, 1994.

This patent describes lithographic printing plates intended to be imaged by means of laser devices that emit in the infrared region. Both wet plates that utilize fountain solution during printing and dry plates to which ink is applied directly are described. Laser output either ablates one or more layers or physically transforms a surface layer whereby exposed areas exhibit an affinity for ink or an ink-abhesive fluid, such as fountain solution, that differs from that of unexposed areas.

(18) Reardon et al, U.S. Pat. No. 5,395,729, issued Mar. 7, 1995.

This patent describes a laser-induced thermal transfer process useful in applications such as color proofing and lithography. In this process, an assemblage comprising a donor element and a receiver element is imagewise exposed to laser radiation, the donor element is separated from the receiver element, and the receiver element is subjected to a post-transfer treatment to substantially eliminate back-transfer.

(19) European Patent Application No. 0 001 068, published Mar. 21, 1979.

This patent application describes a process for preparing a lithographic printing plate by providing an aluminum substrate having a hydrophilic porous anodic oxide layer thereon and depositing an oleophilic image in and on the porous layer by sublimation.

(20) European Patent Application No. 0 573 091, published Dec. 8, 1993.

This patent application describes a lithographic printing plate comprising a support having an oleophilic surface, a recording layer that is capable of converting laser beam radiation into heat, and an oleophobic surface layer. The recording layer and the oleophobic surface layer can be the same layer or separate layers. The printing plate is imagewise exposed with a laser beam and is then rubbed to remove the oleophobic surface layer in the exposed areas so as to reveal the underlying oleophilic surface and thereby form a lithographic printing surface.

Lithographic printing plates designed to eliminate the need for a developing solution which have been proposed heretofore have suffered from one or more disadvantages which have limited their usefulness. For example, they have lacked a sufficient degree of discrimination between oleophilic image areas and hydrophilic non-image areas with the result that image quality on printing is poor, or they have had oleophilic image areas which are not sufficiently durable to permit long printing runs, or they have had hydrophilic non-image areas that are easily scratched and worn, or they have been unduly complex and costly by virtue of the need to coat multiple layers on the support.

It is toward the objective of providing an improved lithographic printing plate that requires no alkaline developing solution, that is simple and inexpensive, and which overcomes many of the limitations and disadvantages of the prior art that the present invention is directed.

SUMMARY OF THE INVENTION

In accordance with this invention, a lithographic printing plate is comprised of an anodized aluminum support and an image-forming layer overlying the support; the image-forming layer comprising an infrared-absorbing agent dispersed in a film-forming polymeric binder; the film-forming polymeric binder being a cyanoacrylate polymer and the infrared-absorbing agent being dispersed therein in an amount sufficient for the image-forming layer to be imaged by laser-induced thermal ablation which completely removes the image-forming layer in exposed regions thereof to thereby reveal the underlying support.

The lithographic printing plates of this invention are positive-working plates. The image-forming layer, which is both oleophilic and infrared-absorptive, is removed in the exposed regions so that the non-exposed regions serve as the ink-transferring surface in lithographic printing. Since the exposure step completely removes the image-forming layer in the exposed regions, the underlying anodized aluminum support is revealed in these regions and it provides a highly durable hydrophilic surface that is especially well adapted for use in lithographic printing.

The use of film-forming cyanoacrylate polymers in the image-forming layer provides many advantages in comparison with prior plates of the ablation type. While many types of laser-written lithographic printing plates have been proposed heretofore, there have been many limitations and disadvantages associated with their use which have hindered their commercialization. Thus, for example, it is highly desirable to eliminate all potential causes of system variability such as the need to wipe the laser-written plate to remove residual material. It is also desirable to reduce the energy requirement for imaging, thereby increasing throughput and decreasing system costs. It is of particular importance to reduce the number of layers which have to be coated to form the plate, thereby simplifying the coating process and reducing media costs. The ability to use highly reliable and relatively inexpensive diode lasers in the imaging step is particularly advantageous. To be commercially successful, the plates should require relatively low exposure, should roll up quickly on press, should exhibit no scumming, should have good ink receptivity, should have good wear characteristics and should provide long run lengths. The novel lithographic printing plates described herein are unique in successfully meeting all of these many requirements.

DETAILED DESCRIPTION OF THE INVENTION

The lithographic printing plates of the present invention are characterized by (1) a durable oleophilic image, (2) hydrophilic non-image areas that are highly resistant to scratching or other damage and (3) excellent discrimination between the oleophilic image areas and the hydrophilic non-image areas which provides a high quality lithographic printing surface.

In the present invention, the image is generated in the image-forming layer by a process of laser-induced thermal ablation. In carrying out such process, a laser that emits in the infrared region is used and the image-forming layer must be sufficiently infrared-absorptive to bring about imagewise-generation of heat sufficient to completely remove the exposed areas by thermal ablation. Such use of a laser renders it feasible to obtain the high degree of image resolution needed for lithographic printing plates.

The printing plates of this invention utilize an anodized aluminum support. Examples of such supports include aluminum which has been anodized without prior graining, aluminum which has been grained and anodized, and aluminum which has been grained, anodized and coated with a hydrophilic barrier layer such as a silicate layer. An anodized aluminum support is highly advantageous because of its affinity for the fountain solution used on a printing press and because it is extremely wear resistant. It is particularly preferred in this invention to use aluminum which has been both grained and anodized.

The image-forming layer utilized in this invention typically has a thickness in the range of from about 0.0002 to about 0.02 millimeters and more preferably in the range of from about 0.0004 to about 0.002 millimeters. It is prepared by coating the anodized aluminum support with a coating composition comprising the infrared-absorbing agent and the cyanoacrylate polymer binder.

A wide range of infrared absorbers suitable for use in elements which employ laser-induced thermal ablation are known in the art and described in numerous patents such as for example, U.S. Pat. Nos. 4,912,083, 4,942,141, 4,948,776, 4,948,777, 4,948,778, 4,950,639, 4,950,640, 4,952,552, 4,973,572 and 5,036,040. Any of these infrared absorbers can be used in the present invention.

Incorporation of an infrared absorber in the image-forming layer in an appropriate concentration renders it sensitive to infrared radiation and capable of generating a high resolution image by imagewise laser-induced thermal ablation. The infrared absorber can be a dye or pigment. A very wide range of such compounds is well known in the art and includes dyes or pigments of the squarylium, croconate, cyanine, merocyanine, indolizine, pyrylium and metal dithiolene classes.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

Examples of preferred infrared-absorbing dyes for use in this invention are the following:

IR-1

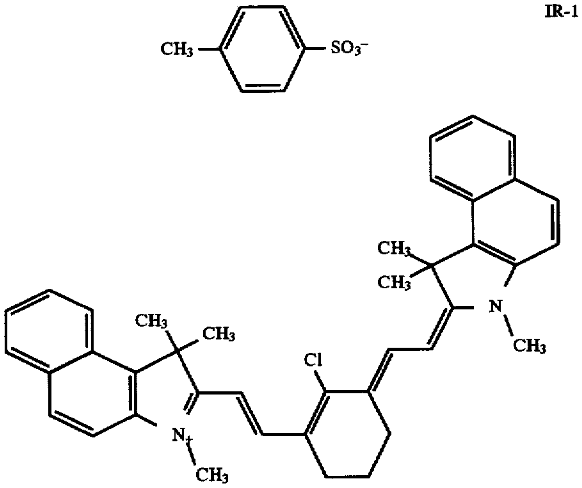

2-[2-[2-chloro-3-[(1,3-dihydro-1,1,3-trimethyl-2H-benz[e]indol-2-ylidene)ethylidene-1-cyclohexe-1-yl]ethenyl]-1,1,3-trimethyl-1H-benz[e]indolium salt with 4-methylbenzenesulfonic acid

IR-2

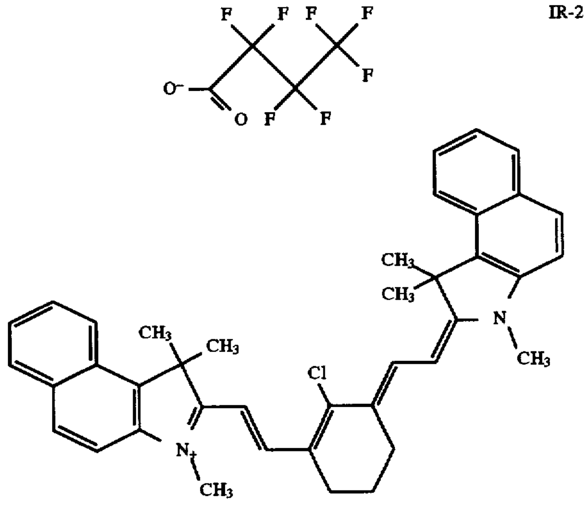

2-[2-[2-chloro-3-[(1,3-dihydro-1,1,3-trimethyl-2H-benz[e]indol-2-ylidene)ethylidene-1-cyclohexe-1-yl]ethenyl-1,1,3-trimethyl-1H-benz[e]indolium salt with heptafluorobutyrate

IR-3

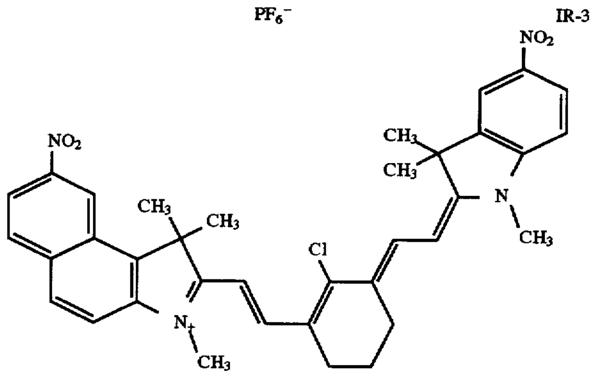

2-(2-(2-chloro-(3-(1,3-dihydro-1,3,3-trimethyl-5-nitro-2H-indol-2-ylidene)ethylidene)-1-cyclohexene-1-yl)ethenyl)-1,3,3-trimethyl-5-nitro-3H-indolium hexafluorophosphate

IR-4

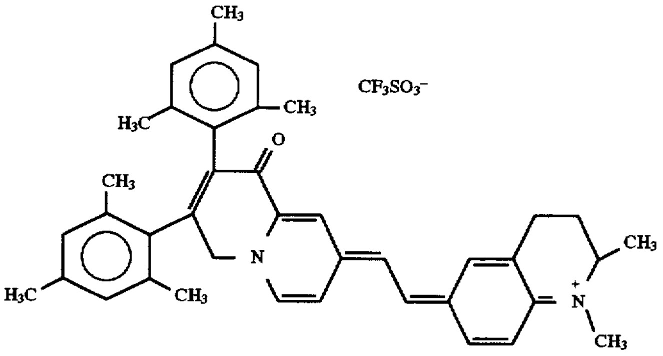

2,3,4,6-tetrahydro-1,2-dimethyl-6-[[1-oxo-2,3-bis(2,4,6-trimethylphenyl)-7(1H)-indolizinylidene]ethylidene]quinolinium trifluoromethanesulfonate.

Ingredients which can be optionally included in the image-forming layer utilized in this invention include colorants, such as visible dyes, ultraviolet dyes, organic pigments or inorganic pigments, which render the layer colored and thus make it easier to determine if there are any coating defects. Colorants incorporated in the image-forming layer should not be soluble in printing ink since such solubility will result in contamination of the ink and a reduction in structural integrity of the image which can result in wear failure of the printing plate.

The cyanoacrylate polymers utilized in this invention have many advantageous properties for use in an image-forming layer of a lithographic printing plate, including a relatively low decomposition temperature (typically about 250° C.), good ink affinity, excellent adhesion to the surface of anodized aluminum, and high wear resistance.

The useful cyanoacrylate polymers include homopolymers of a single cyanoacrylate monomer such as poly(methyl-2-cyanoacrylate) or poly(ethyl-2-cyanoacrylate), copolymers of two different cyanoacrylate monomers such as poly(methyl-2-cyanoacrylate-co-ethyl-2-cyanoacrylate) and interpolymers of three or more cyanoacrylate monomers such as poly(methyl-2-cyanoacrylate-co-ethyl-2-cyanoacrylate-co-propyl-2-cyanoacrylate).

In addition to poly(alkyl cyanoacrylates), such as those described above, excellent results are also obtained with poly(alkoxyalkyl cyanoacrylates) such as poly(methoxyethyl-2-cyanoacrylate).

Film-forming cyanoacrylate polymers useful in this invention can also be prepared by copolymerizing a cyanoacrylate monomer with one or more ethylenically-unsaturated copolymerizable monomers such as, for example, acrylates, methacrylates, acrylamides, methacrylamides, vinyl ethers, butadienes, styrenes, alpha-methylstyrenes, and the like.

Specific illustrative examples of cyanoacrylate polymers useful in this invention include the following:

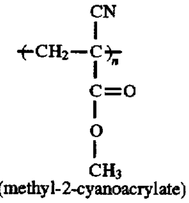

poly(methyl-2-cyanoacrylate)

-continued

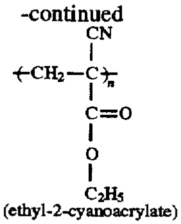

poly (ethyl-2-cyanoacrylate)

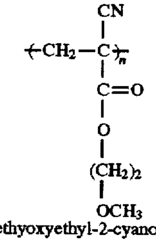

poly(methyoxyethyl-2-cyanoacrylate)

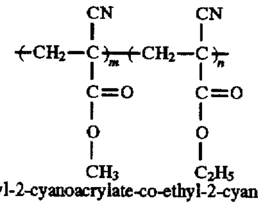

poly(methyl-2-cyanoacrylate-co-ethyl-2-cyanoacrylate).

In the structural formulas provided above, m and n are integers whose value is dependent on the molecular weight of the cyanoacrylate polymer.

The molecular weight of the cyanoacrylate polymers utilized as binders in this invention is typically in the range of from about 10000 to about 1,000,000 and preferably in the range of from about 50,000 to about 400,000.

When the cyanoacrylate monomer is copolymerized with one or more ethylenically-unsaturated copolymerizable monomers, it is preferred that the resulting polymer comprises at least 50 mole percent of the cyanoacrylate monomer.

In the image-forming layer of the lithographic printing plates of this invention, the infrared-absorbing agent is typically utilized in an amount of from about 0.2 to about 4 parts per part by weight of the cyanoacrylate polymer and preferably in an amount of from about 0.5 to about 2.5 parts per part by weight of the cyanoacrylate polymer.

In the manufacture of the printing plates of this invention, a coating composition is formed by combining the cyanoacrylate polymer and the infrared-absorbing agent with a suitable solvent or solvent mixture to form a coating composition, coating a thin layer of this composition on the support, and drying the coated layer.

In preparing the printing plates of this invention, conditions employed in coating and drying the image-forming layer, such as, for example, the solvent system utilized and the temperature and air flow in drying, are selected to provide strong bonding of the image-forming layer to the support. This is in contrast with the invention of the aforesaid copending commonly-assigned U.S. patent application Ser. No. 260,652 wherein the image-forming layer is designed to be readily removable from the support by means such as peeling or rubbing so that conditions employed in coating and drying are those which facilitate the ready removal of the unexposed image-forming layer.

With the printing plates of this invention, the image is generated by a step of imagewise laser-induced thermal ablation of the image-forming layer. Typically, such step requires an energy input in the range of from about 300 to about 1400 millijoules per square centimeter ($mJ/cm^2$). Suitable apparatus for carrying out the laser-induced thermal ablation is well known in the art. An example of such apparatus is the thermal print engine described in Baek and DeBoer, U.S. Pat. No. 5,168,288, the disclosure of which is incorporated herein by reference. Removal of the ablated material can be carried out by suitable suction devices well known in the art.

In the present invention, the laser energy applied is sufficient to cause the material in the regions which are exposed to be ejected from the image-forming layer, thereby revealing the underlying support.

The lithographic printing plates of this invention are particularly advantageous in that they exhibit good "rollup" characteristics, that is, the number of copies which must be printed to get the first acceptable copy is low. They are also particularly advantageous in that they are highly resistant to "blinding." The term "blinding" is well known in the lithographic printing art and refers to inability of the image areas of the printing plate to adequately take up printing ink.

The invention is further illustrated by the following examples of its practice taken in conjunction with the comparative examples.

EXAMPLE 1–4

Lithographic printing plates in accordance with the invention were prepared using as the support a grained and anodized aluminum sheet material having a thickness of 137.5 micrometers, an oxide mass of 2.5 $g/m^2$ and a silicate barrier layer overlying the anodic aluminum surface. To prepare the plate, the aluminum support was coated with a coating composition containing infrared-absorbing dye IR-1 and the polymeric binder dissolved in acetonitrile.

The binder employed, the amount of binder and the amount of IR-1 for each of Examples 1 to 4 are described in Table 1 below.

TABLE 1

| Example No. | Amount of IR-1 ($g/m^2$) | Binder | Amount of Binder ($g/m^2$) |
|---|---|---|---|
| E-1 | 0.22 | poly(methyl-2-cyanoacrylate) | 0.16 |
| E-2 | 0.22 | poly(methyl-2-cyanoacrylate-co-ethyl-2-cyanoacrylate)* | 0.16 |
| E-3 | 0.22 | poly(methoxyethyl-2-cyanoacrylate) | 0.11 |
| E-4 | 0.22 | poly(methoxyethyl-2-cyanoacrylate) | 0.22 |

*The copolymer was 70 mole % methyl-2-cyanoacrylate and 30 mole % ethyl-2-cyanoacrylate.

Comparative Examples C-1 to C-16 utilized binders other than cyanoacrylate polymers. The same anodized aluminum support and IR-absorbing dye was used in the Comparative Examples as in Examples 1 to 4. In each case, the dry laydown for the IR-absorbing dye was 0.16 $g/m^2$ and the dry laydown for the polymer was 0.22 $g/m^2$. The polymers employed and the solvents from which they were coated are described in Table 2 below. In Table 2, the term "IR-modified polymer" refers to a polymer with an infrared-absorbing group attached to the polymer chain. This polymer can be represented by the following formula:

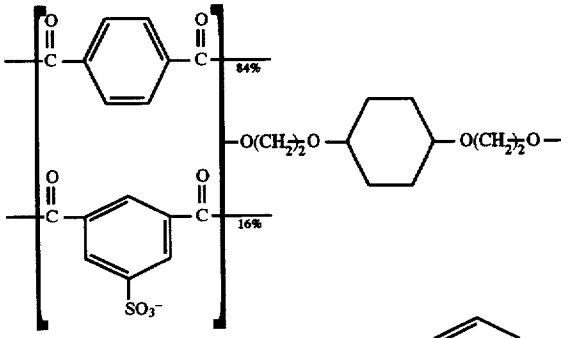

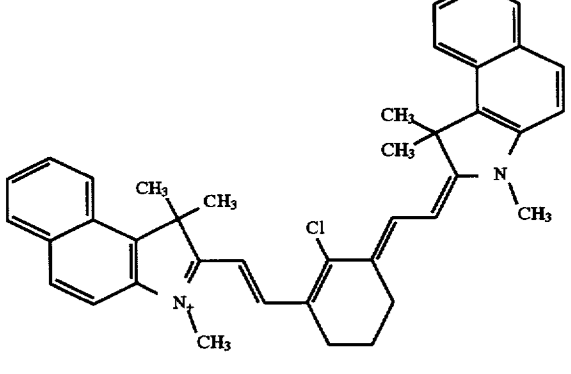

TABLE 2

| Comparative Example No. | Binder | Coating[(1)] Solvent |
|---|---|---|
| C-1 | nitrocellulose | ACT |
| C-2 | cellulose acetate butyrate | ACT |
| C-3 | poly(vinyl acetate) | MEK |
| C-4 | poly(methyl acrylate) | MEK |
| C-5 | polystyrene | MEK |
| C-6 | polycarbonate | DCM |
| C-7 | poly(α-methylstyrene) | MEK |
| C-8 | cellulose acetate (39% acetyl) | ACT |
| C-9 | polydimethylsiloxane | DCM |
| C-10 | BUTVAR B-73[(2)] | MEK |
| C-11 | BUTVAR B-76 (12% hydroxy)[(2)] | MEW |
| C-12 | polyvinyl chloride | MEK |
| C-13 | poly(methyl methacrylate) | MEK |
| C-14 | cellulose acetate butyrate | ACT |
| C-15 | IR-modified polymer | DCM |
| C-16 | XU-218 polyimide[(3)] | NMP |

[(1)]ACT = acetone
MEK = methyl ethyl ketone
DCM = dichloromethane
NMP = 1-methyl-2-pyrrolidinone
[(2)]BUTVAR B-73 and BUTVAR B-76 are trademarks for polyvinyl butyrals available from MONSANTO COMPANY
[(3)]This polymer is a polyimide that is commercially available from Ciba-Geigy Corporation.

press latitude. Samples of the polymers used as binders were also evaluated by thermal gravimetric analysis and surface energy measurements. Polymer samples were placed on the weight pan and heated at the rate of 10° C. per minute in nitrogen. Plate performance was seen to correlate to some degree with the temperature at which half the polymer weight was lost; however, this was not the only criterion leading to optimum behavior. Although polymers such as nitrocellulose and poly(α-methylstyrene) are well-known for their low decomposition temperatures and have good ablation characteristics, these factors alone are not sufficient to result in the production of good printing plates. The cyanoacrylate polymers give superior performance due to the combination of low decomposition temperature, good ink receptivity, good adhesion to the support and good wear characteristics.

| Example | TGA* (C at ½ LOSS) | RANK ORDER | ROLLUP (# to 1st acceptable) | SPEED (rev./min.) | RUN LENGTH | COMMENT |
|---|---|---|---|---|---|---|
| E-1 | 197 | 1 | 10 | 700 | 8200+ | Good rollup — good ink discrimination — good wear resistance |
| E-2 | 230 | 2 | 10 | 600 | 8200+ | Good rollup — good ink discrimination — good wear resistance |
| E-3 | 250 | 3 | 25 | 800 | 8200+ | Slow rollup — good ink discrimination — good wear resistance |
| E-4 | 250 | 4 | 25 | 800 | 8200+ | Slow rollup — good ink discrimination — good wear resistance |
| C-1 | 197 | 5 | 3 | 800 | <100 | Good rollup — good ink discrimination — some blinding |
| C-2 | 355 | 6 | 5 | 400 | 8200 | Poor prints — has reversed image (i.e. negative image) |
| C-3 | 342 | 7 | 10 | 600 | 5200 | Poor rollup — reversed image <30 — good prints >50 |
| C-4 | — | 8 | 100 | 800 | 8200 | Scumming by 8000 impressions |
| C-5 | 372 | 9 | 100 | 800 | 3000 | Much wear after 3000 impressions |
| C-6 | 524 | 10 | 250 | 400 | 8200 | Scumming after 8200 impressions |
| C-7 | 320 | 11 | 100 | 600 | 1000 | Poor ink discrimination — much wear after 1000 impressions |
| C-8 | 361 | 12 | 10 | 600 | >50 | Inks everywhere after 50 impressions |
| C-9 | — | 13 | 20 | 800 | 200 | Poor quality coating — repels ink — faint images |
| C-10 | — | Failed | NONE | NONE | NONE | Inked everywhere — no discrimination |
| C-11 | 390 | Failed | NONE | NONE | NONE | Inked everywhere — no discrimination |
| C-12 | 304 | Failed | NONE | NONE | NONE | Inked everywhere — no discrimination |
| C-13 | 349 | Failed | 10 | 600 | NONE | Inked everywhere by 30 impressions |
| C-14 | 355 | Failed | NONE | NONE | NONE | Reversed image |
| C-15 | 385 | Failed | NONE | NONE | NONE | Starts positive but goes negative, inks everywhere by 50 impressions |
| C-16 | 573 | Failed | NONE | NONE | NONE | Faint image at start — then inks everywhere |

*thermogravimetric analysis

All of the lithographic plates were exposed with an external lathe-type drum printer to a 600 mW per channel laser beam (830 nm), with 9 channels per revolution, a spot size of approximately 12 μm×25 μm, recording at 2400 lines per inch (945 lines per cm) and drum speeds of up to 800 rpm (revolutions per minute), drum circumference of 52.92 cm.

After exposure, the exposed area appeared as a faint green against a dark green background. Exposed plates were mounted on an A. B. Dick Company press without wiping or processing. Plates were contacted with fountain solution and then inked. Press runs were evaluated for speed of rollup, ink receptivity, ink discrimination, scumming, wear characteristics and run length. The results are summarized in Table 3. The plates tested were rank ordered for overall quality and The present invention permits lithographic printing plates to be prepared directly from digital data without the need for intermediate films and conventional time-consuming optical printing methods. The plates are imagewise exposed to a focused high-intensity laser beam which removes the oleophilic image-forming layer in the exposed regions. The plates require relatively low exposures, compared to those needed with other laser plate-making processes, and are well-suited for exposure by relatively inexpensive and highly reliable diode lasers. In addition, the printing plates of this invention require no post-processing, thereby saving time and eliminating the expense, maintenance and floor space of a plate processor. The plates have superior performance compared to plates made with other binders known in the art. They roll up quickly, show good ink discrimination, do not scum, do not blind and have superior wear resistance for long runs. Post-exposure baking or exposure to ultraviolet or visible light sources is not required. Since no chemical processing, wiping, brushing, baking or treatment of any kind is required, it is feasible to expose the printing plate directly on the printing press by equipping the press with a laser exposing device and suitable means, such as a lead screw, to control the position of the laser exposing device.

The invention has been described in detail, with particular reference to certain preferred embodiments thereof, but it should be understood that variations and modifications can be effected within the spirit and scope of the invention.

We claim:

1. A method of providing a positive image comprising:

A) providing a lithographic printing plate comprising an anodized aluminum support and an image-forming layer overlying said support, said image-forming layer comprising an infrared-absorbing agent dispersed in a film-forming polymeric binder, said film-forming polymeric binder being a cyanoacrylate polymer and said infrared-absorbing agent being dispersed therein in an amount sufficient for said image-forming layer to be imaged by laser-induced thermal ablation which completely removes said image-forming layer in exposed regions thereof to thereby reveal said underlying support, and B) imagewise directing infrared laser radiation to said printing plate to thermally ablate said image-forming layer in said exposed regions thereof to form a positive image.

2. The method of claim 1 wherein the energy input used in step B is from about 300 to about 1400 millijoules/cm$^2$.

3. The method of claim 1 wherein said lithographic printing plate is mounted on a printing press before step B is carried out.

4. The method of claim 1 wherein said lithographic printing plate support is both grained and anodized.

5. The method of claim 4 wherein said lithographic printing plate support is grained, anodized and provided with a hydrophilic barrier layer.

6. The method of claim 1 wherein said infrared-absorbing agent is a dye or pigment of the squarylium, croconate, cyanine, merocyanine, indolizine, pyrylium or metal dithiolene classes.

7. The method of claim 1 wherein said infrared-absorbing agent is an infrared-absorbing dye of the formula:

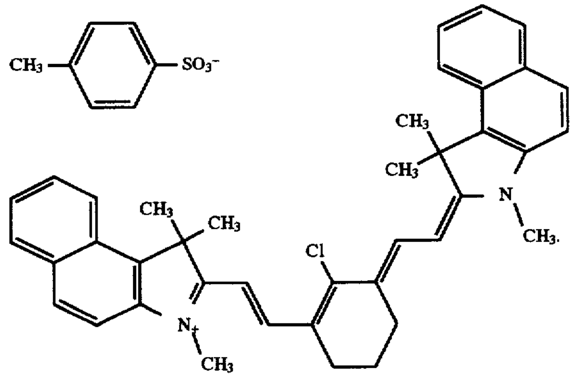

8. The method of claim 1 wherein said infrared-absorbing agent is an infrared-absorbing dye of the formula:

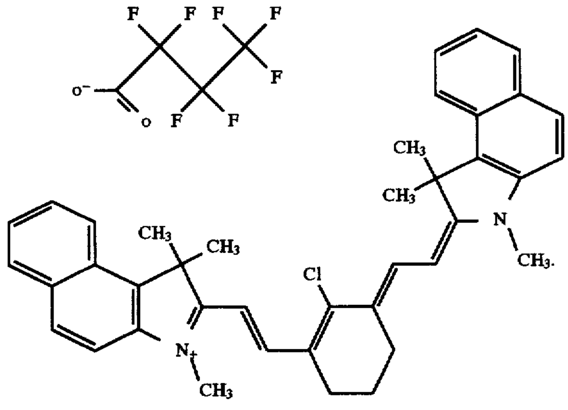

9. A method of claim 1 wherein said infrared-absorbing agent is an infrared-absorbing dye of the formula:

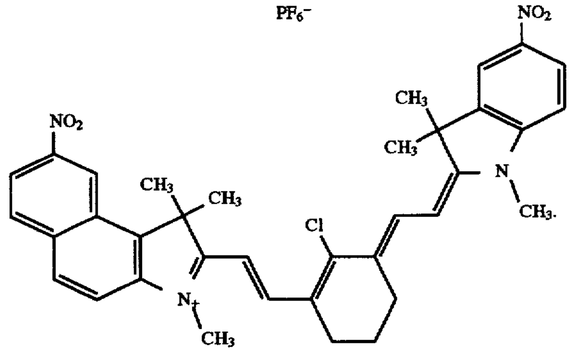

10. The method of claim 1 wherein said infrared-absorbing agent is an infrared-absorbing dye of the formula:

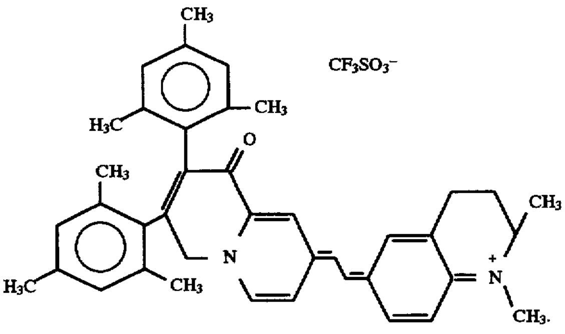

11. The method of claim 1 wherein said cyanoacrylate polymer is a poly(alkyl cyanoacrylate).

12. The method of claim 1 wherein said cyanoacrylate polymer is a poly(alkoxyalkyl cyanoacrylate.

13. The method of claim 1, wherein said cyanoacrylate polymer has a molecular weight in the range of from about 50,000 to about 400,000.

14. The method of claim 1 wherein said cyanoacrylate polymer is poly(methyl-2-cyanoacrylate, poly(ethyl-2-cyanoacrylate), poly(methyl-2-cyanoacrylate-co-ethyl-2-cyanoacrylate) or poly(methoxyethyl-2-cyanoacrylate).

15. The method of claim 1 wherein said lithographic printing plate imaging layer has a thickness of from about 0.0002 to about 0.02 mm.

16. The method of claim 1 wherein said cyanoacrylate polymer is a copolymer of one or more cyanoacrylate monomers with one or more ethylenically unsaturated copolymerizable monomers selected from the group consisting of acrylates, methacrylates, acrylamides, methacrylamides, vinyl ethers, butadienes, styrenes and α-methylstyrenes, wherein said cyanoacrylate polymer comprises at least 50 mole percent of the one or more cyanoacrylate monomers.

17. The method of claim 1 wherein said infrared-absorbing agent is present in said image-forming layer in an amount of from about 0.2 to about 4 parts per part by weight of said cyanoacrylate polymer.

18. A method of imaging comprising:

A) mounting a lithographic printing plate on a printing press or plate setting device, said plate comprising an anodized aluminum support and an image-forming layer overlying said support, said image-forming layer comprising an infrared-absorbing agent dispersed in a film-forming polymeric binder, said film-forming polymeric binder being a cyanoacrylate polymer and said infrared-absorbing agent being dispersed therein in an amount sufficient for said image-forming layer to be imaged by laser-induced thermal ablation which completely removes said image-forming layer in exposed regions thereof to thereby reveal said underlying support, and B) imagewise directing infrared laser radiation to said printing plate to thermally ablate said image-forming layer in said exposed regions thereof to form a positive image.

19. The method of claim 18 wherein said imaged lithographic printing plate is inked and used in press runs.

20. The method of claim 19 carried out without wiping or processing said imaged lithographic printing plate before said imaged plate is inked and used in press runs, said inking being carried out with or without the addition of a fountain solution.

* * * * *